United States Patent
Huo et al.

(10) Patent No.: US 10,923,467 B2
(45) Date of Patent: Feb. 16, 2021

(54) SERIES RESISTOR OVER DRAIN REGION IN HIGH VOLTAGE DEVICE

(71) Applicant: Taiwan Semiconductor Manufacturing Co., Ltd., Hsin-Chu (TW)

(72) Inventors: Ker Hsiao Huo, Zhubei (TW); Fu-Chih Yang, Fengshan (TW); Chun Lin Tsai, Hsin-Chu (TW); Yi-Min Chen, Hsinchu (TW); Chih-Yuan Chan, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/584,773

(22) Filed: Sep. 26, 2019

(65) Prior Publication Data

US 2020/0027874 A1    Jan. 23, 2020

Related U.S. Application Data

(60) Continuation of application No. 15/942,728, filed on Apr. 2, 2018, now Pat. No. 10,483,259, which is a
(Continued)

(51) Int. Cl.
*H01L 27/06* (2006.01)
*H01L 29/40* (2006.01)
(Continued)

(52) U.S. Cl.
CPC .. *H01L 27/0288* (2013.01); *H01L 21/823437* (2013.01); *H01L 21/823456* (2013.01);
(Continued)

(58) Field of Classification Search
CPC ............... H01L 29/405; H01L 29/4238; H01L 29/0692; H01L 29/0696; H01L 21/41758;
(Continued)

(56) References Cited

U.S. PATENT DOCUMENTS 5,498,899 A    3/1996  Palara
6,680,515 B1   1/2004  Hsing
(Continued)

OTHER PUBLICATIONS

F. Udrea, "State-of-the-art technologies and devices for high-voltage integrated circuits", IET Circuits Devices Syst., vol. 1, No. 5, p. 357-365, Oct. 2007.
(Continued)

*Primary Examiner* — Matthew E Warren
(74) *Attorney, Agent, or Firm* — Eschweiler & Potashnik, LLC

(57) ABSTRACT

Some embodiments relate to an integrated circuit. The integrated circuit includes a ring-shaped drain region having an inner edge and an outer edge. A channel region surrounds the ring-shaped drain region. A source region surrounds the channel region. The channel region separates the drain region from the source region. A gate electrode is arranged over the channel region and is separated from the channel region by a gate dielectric. An inner edge of the gate electrode is proximate to the drain region. A resistor structure is arranged over and spaced apart from an upper surface of the substrate. The resistor structure has a first end and a second end which are connected by a curved or polygonal path of resistive material. The first end is coupled to the ring-shaped drain. The resistor has an outer perimeter that is surrounded by the inner edge of the ring-shaped drain region.

20 Claims, 10 Drawing Sheets

Related U.S. Application Data division of application No. 14/208,791, filed on Mar. 13, 2014, now Pat. No. 9,941,268.

(51) Int. Cl.
*H01L 29/417* (2006.01)
*H01L 29/423* (2006.01)
*H01L 27/02* (2006.01)
*H01L 21/8234* (2006.01)
*H01L 49/02* (2006.01)
*H01L 29/06* (2006.01)
*H01L 23/522* (2006.01)

(52) U.S. Cl.
CPC ............... *H01L 21/823475* (2013.01); *H01L 21/823493* (2013.01); *H01L 27/0629* (2013.01); *H01L 28/20* (2013.01); *H01L 29/0692* (2013.01); *H01L 29/0696* (2013.01); *H01L 29/405* (2013.01); *H01L 29/41758* (2013.01); *H01L 23/5228* (2013.01); *H01L 29/4175* (2013.01); *H01L 29/4238* (2013.01); *H01L 2924/0002* (2013.01)

(58) Field of Classification Search
CPC ..... H01L 21/823425; H01L 21/823437; H01L 21/823456; H01L 21/823493
USPC ......................................... 257/335, 401, 536
See application file for complete search history.

(56) References Cited

U.S. PATENT DOCUMENTS

| | | | |
|---|---|---|---|
| 7,306,999 B2 * | 12/2007 | Hall | H01L 27/0288 257/528 |
| 2001/0048122 A1 | 12/2001 | Tada et al. | |
| 2009/0039424 A1 | 2/2009 | Su et al. | |
| 2012/0154026 A1 | 6/2012 | Karino et al. | |
| 2012/0292740 A1 * | 11/2012 | Lin | H01L 28/20 257/536 |
| 2013/0032895 A1 * | 2/2013 | Disney | H01L 29/7835 257/409 |
| 2013/0093010 A1 * | 4/2013 | Huang | H01L 29/7816 257/335 |
| 2014/0021560 A1 * | 1/2014 | Su | H01L 27/0629 257/380 |
| 2015/0008539 A1 | 1/2015 | Kanda et al. | |

OTHER PUBLICATIONS

Non-Final Office Action dated Sep. 15, 2015 for U.S. Appl. No. 14/208,791.
Final Office Action dated May 20, 2016 for U.S. Appl. No. 14/208,791.
Non-Final Office Action dated Jan. 12, 2017 for U.S. Appl. No. 14/208,791.
Final Office Action dated Jul. 28, 2017 for U.S. Appl. No. 14/208,791.
Notice of Allowance dated Nov. 29, 2017 for U.S. Appl. No. 14/208,791.
Non-Final Office Action dated Mar. 22, 2019 for U.S. Appl. No. 15/942,728.
Notice of Allowance dated Jul. 16, 2019 for U.S. Appl. No. 15/942,728.

* cited by examiner

100

200

200

SERIES RESISTOR OVER DRAIN REGION IN HIGH VOLTAGE DEVICE

REFERENCE TO RELATED APPLICATION

This Application is a Continuation of U.S. application Ser. No. 15/942,728, filed on Apr. 2, 2018, which is a Divisional of U.S. application Ser. No. 14/208,791, filed on Mar. 13, 2014 (now U.S. Pat. No. 9,941,268, issued on Apr. 10, 2018). The contents of the above-referenced Patent Applications are hereby incorporated by reference in their entirety.

BACKGROUND

A power MOSFET is a specific type of metal oxide semiconductor field-effect transistor (MOSFET) designed to handle significant power levels. Compared to the other power semiconductor devices, for example insulated-gate bipolar transistor (IGBT), its main advantages are high commutation speed and good efficiency at low voltages.

Power MOSFETs were made possible by the evolution of CMOS technology, developed for manufacturing integrated circuits in the late 1970s. The power MOSFET shares its operating principle with its low-power counterpart, the lateral MOSFET.

The power MOSFET is perhaps the most widely used low-voltage (e.g., less than 200 V) switch. It can be found in many power supplies, DC to DC converters, and motor controllers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
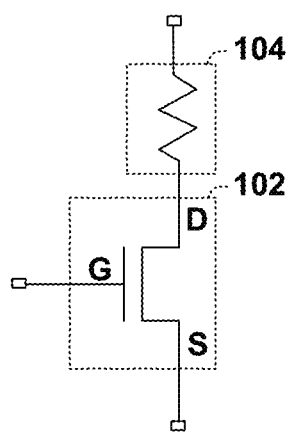
FIG. 1 illustrates a schematic view of a high voltage device in accordance with some embodiments.

The description herein is made with reference to the drawings, where like reference numerals are generally utilized to refer to like elements throughout, and where the various structures are not necessarily drawn to scale. In the following description, for purposes of explanation, numerous specific details are set forth in order to facilitate understanding. It is evident, however, that one or more aspects described herein may be practiced with a lesser degree of these specific details. In other instances, known structures and devices are shown in block diagram form to facilitate understanding.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conventional lateral MOSFETS are ill-equipped to handle high current situations. For example, power surges can occur in conventional lateral MOSFETs and blow out a gate oxide, melt an active region of the device, or cause melting or electro-migration failures for interconnect. The present disclosure provides resistor structures that are arranged on top of drain regions of high voltage MOSFETs to protect high voltage devices in the event of power surges or other high current and/or high voltage operating conditions. These structures are well suited, for example, for devices that operate with bias voltages on the order of or in excess of 100 V, although it is also possible to use these structures at lower voltages.

FIG. 1 shows a schematic view of some embodiments of a high voltage transistor device 100, which includes a transistor 102 having a source region (S), a drain region (D), and a gate electrode (G). A resistor structure 104 is coupled in series to the drain region (D). Several examples which are consistent with this schematic are now provided below.

Figure 2:
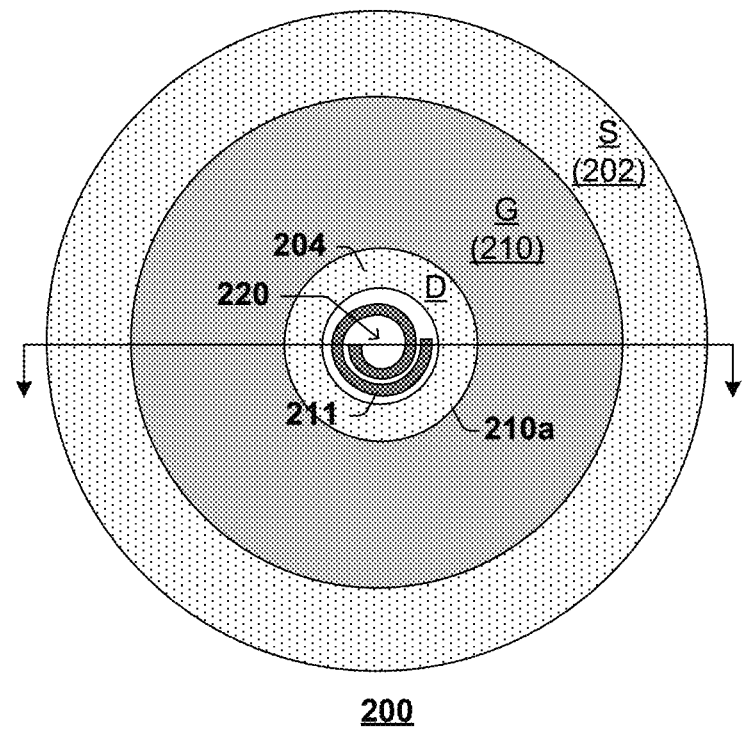
FIG. 2 illustrates a top view of a high voltage device which includes a resistor over a drain region in accordance with some embodiments.
Figure 3:
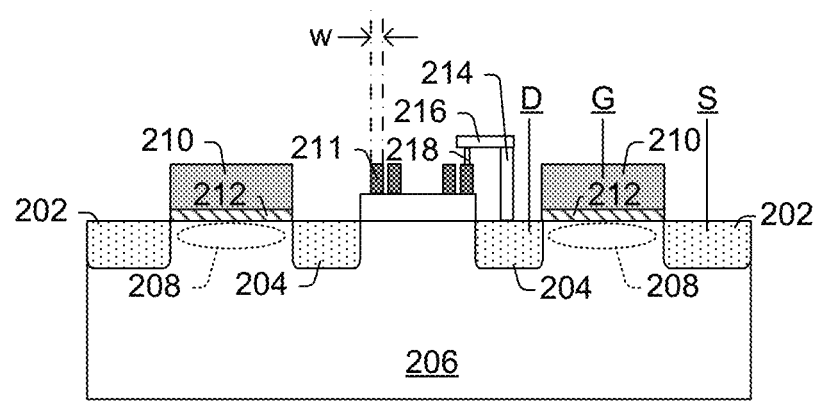
FIG. 3 illustrates a cross-sectional view of FIG. 2's high voltage device in accordance with some embodiments.

FIGS. 2-3, which are now referred to concurrently, show one example of a high voltage device 200 which includes a resistor structure in accordance with some embodiments. The device 200 includes a source region 202 and drain region 204 which are arranged in a semiconductor substrate 206 and which are separated from one another by a channel region 208. The source region 202 concentrically surrounds the channel region 206, and the channel region 208 in turn concentrically surrounds the drain region 204. The gate electrode 210, which is separated from the channel region 208 by a gate dielectric 212, is arranged over the channel region 208 and has an inner edge 210a proximate to the drain region 204. The resistor structure 211 is made up of a curved or polygonal path of resistive material is arranged over the drain region 204 and is coupled to the drain region 204. The resistor structure 211 is perimeterally bounded by the gate electrode inner edge 210a. A drain contact 214 extends upwards from the drain region 204 and is coupled to a metal interconnect layer 216, such as a metal-1 layer. A contact or via 218 extends downward from the metal interconnect layer 216 to the resistor structure 211.

During operation, the resistor structure 211 enhances the breakdown voltage of the device by helping to dissipate power surges over a longer distance than previously available. Thus, this allows the device 200 and its closely coupled resistor structure 211 to withstand significantly larger power surges than previously achievable. In particular, FIGS. 2-3 show an example where the resistor structure 211 is a spiral-shaped structure, which includes a continuously winding path with an ever-decreasing radius of curvature as it approaches a central region 220. In some embodiments, a width, w, of the spiral can be continuous over the spiral-shaped structure to ease manufacture of the device, while in other embodiments the spiral width, w, can change, for example due to tapering at ends of the spiral. This embodiment, as well as other embodiments which exhibit an absence of sharp corners as viewed from above, is advantageous as it limits electric field "kinks" or "spikes". By limiting electric field "kinks" or "spikes", curved edges help to limit hot carrier effects and localized heating, and can thereby improve device performance and reliability.

Figure 4:
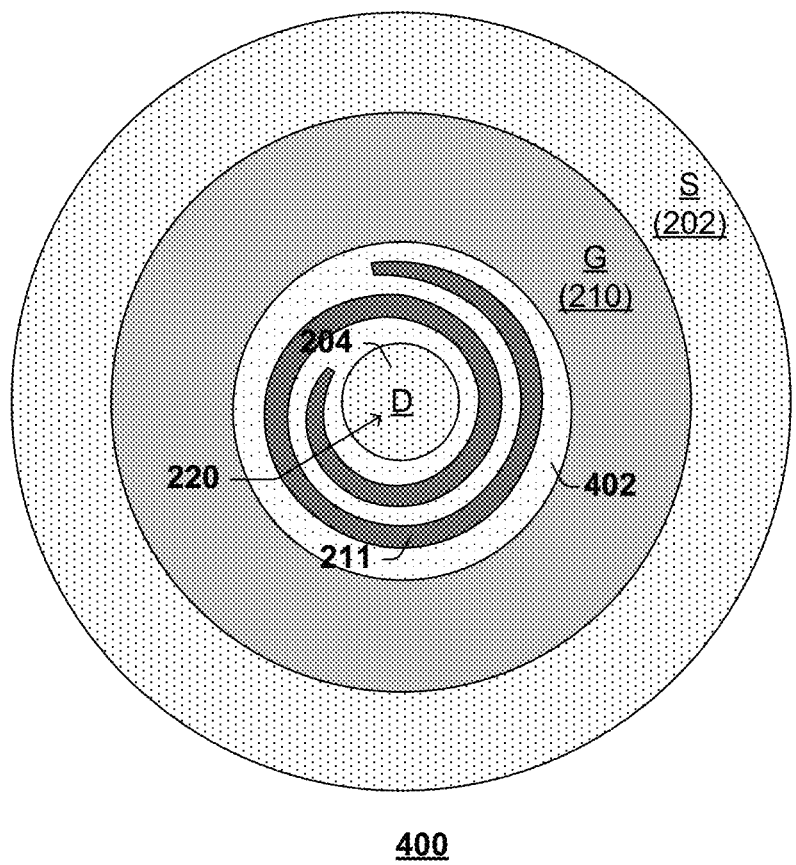
FIG. 4 illustrates a top view of a high voltage device which includes a resistor over a drain region and aligned over a drift region of the device in accordance with some embodiments.
Figure 5:
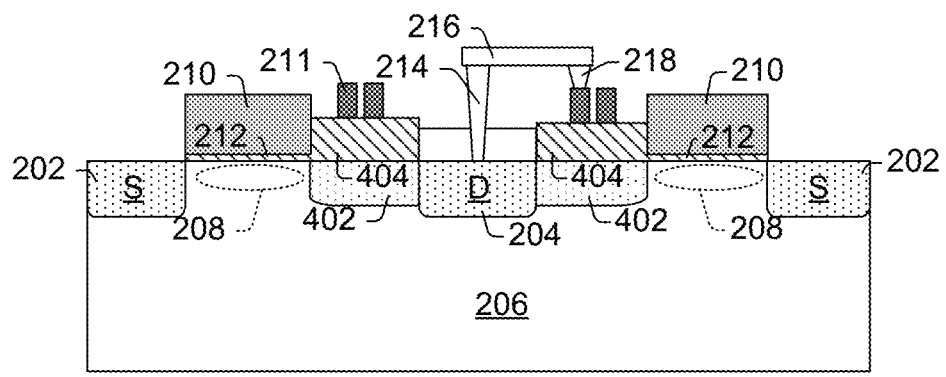
FIG. 5 illustrates a cross-sectional view of FIG. 4's high voltage device in accordance with some embodiments.

FIGS. 4-5 show another example of a high voltage semiconductor device 400 in accordance with some embodiments. The device again includes a source region 202 and drain region 204 concentrically arranged in a semiconductor substrate 206 and which are separated from one another by a channel region 208. In this embodiment, a drift region 402 is concentrically arranged around the drain region 204 and separates the drain region 204 from the channel region 208. In this example, the source and drain regions 202, 204 have a first doping type (e.g., n-type) at a first doping concentration (e.g., n+), while the channel region 208 has a second doping type (e.g., p-type). The drift region 402 has the first doping type (e.g., n-type), but at a lower doping concentration than the source/drain regions 202, 204. In this example, the resistor structure 211 is aligned over the drift region 402 and is separated from the drift region 402 by a field oxide 404. In this configuration, not only does the resistive structure 211 provide an enhanced protection against power surges (e.g., large currents on the drain), but the placement of the resistor structure 211 over the drift region 402 smoothes the electric field of the device in the drift region 402, which can limit hot carrier effects and localized heating, and can thereby improve device performance and reliability.

Figure 6:
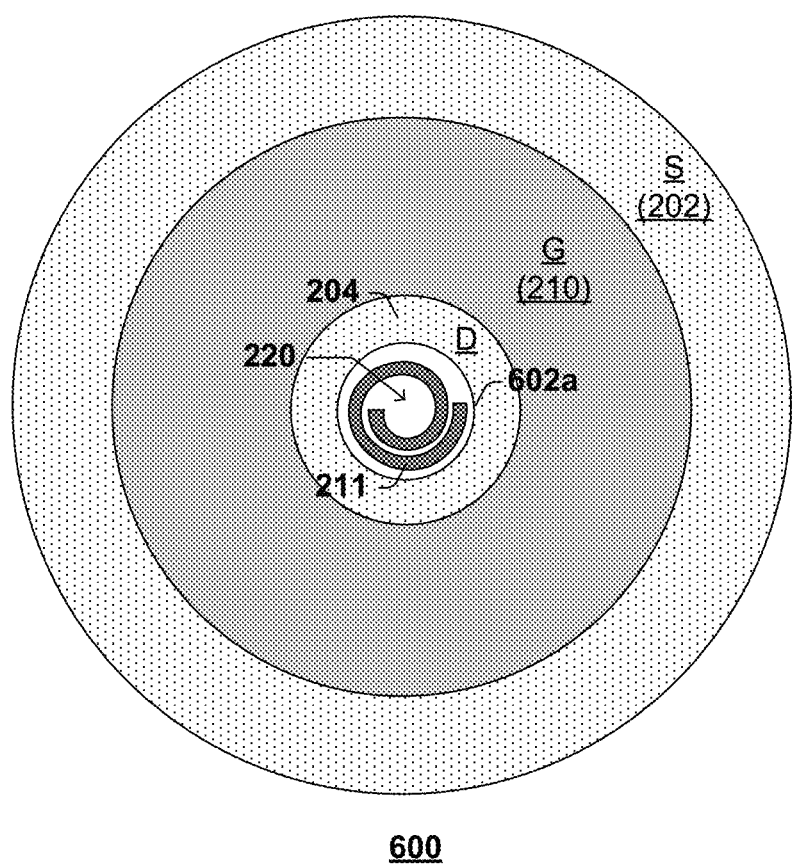
FIG. 6 illustrates a top view of a high voltage device which includes a resistor over a drain region in accordance with some embodiments.
Figure 7:
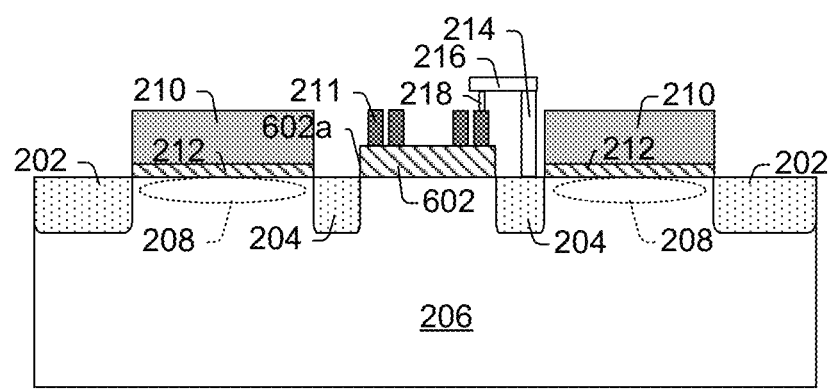
FIG. 7 illustrates a cross-sectional view of FIG. 6's high voltage device in accordance with some embodiments.

FIGS. 6-7 show another example of a high voltage semiconductor device 600 in accordance with some embodiments. In this example, the drain region 204 is ring-shaped and has a field oxide region 602 aligned in its center opening. The resistor structure 211 is aligned over the field oxide layer 602 and perimeterally bounded by an outer edge 602a of the field oxide region 602.

Figure 8:
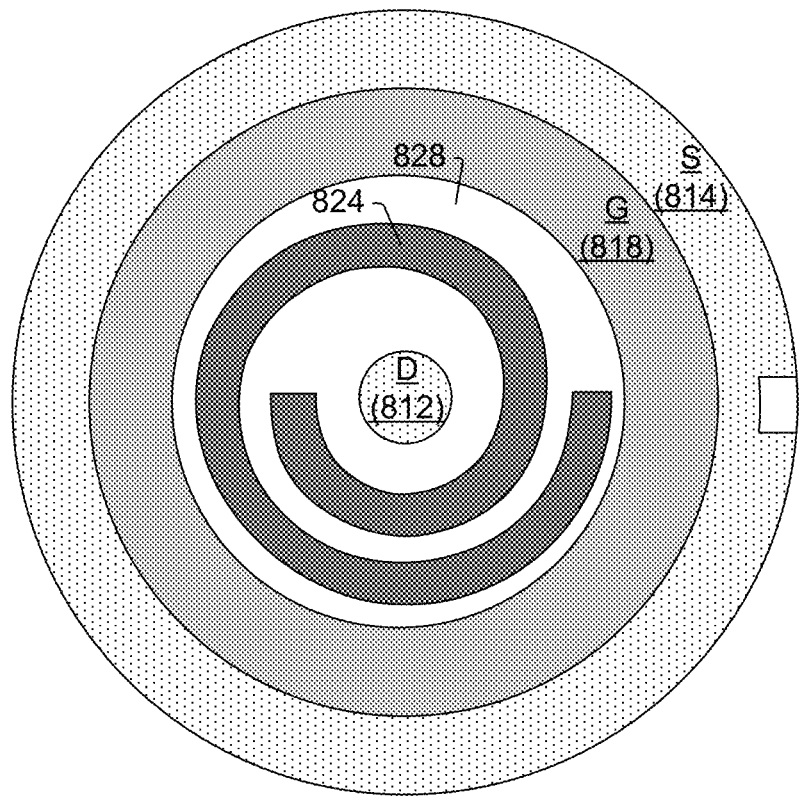
FIG. 8 illustrates a top view of a high voltage device which includes a resistor over a drain region in accordance with some embodiments.
Figure 9:
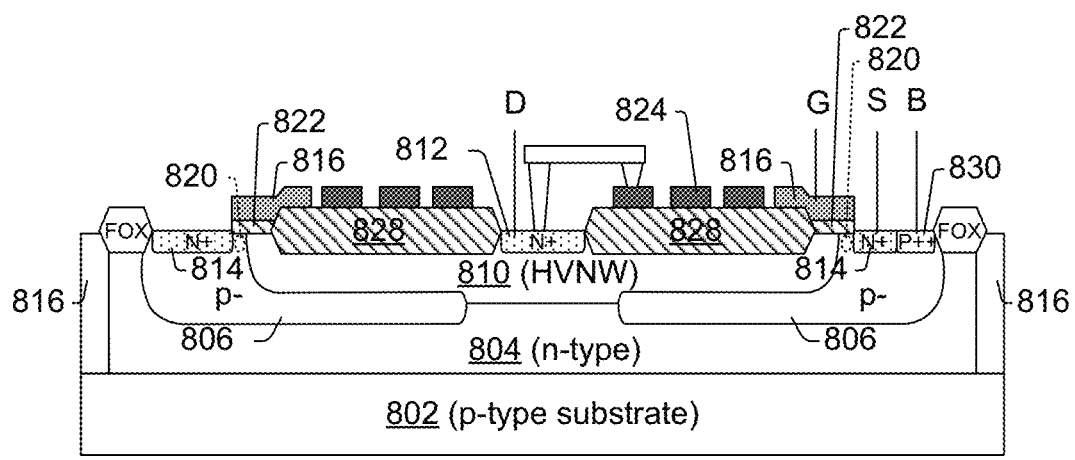
FIG. 9 illustrates a cross-sectional view of FIG. 8's high voltage device in accordance with some embodiments.

FIGS. 8-9 show another example of a high voltage semiconductor device 800 in accordance with some embodiments. In this example, the semiconductor substrate 802 has a first conductivity type (e.g., p-). A buried well region 804, which has a second conductivity type (e.g., n-) is arranged in the semiconductor substrate. A body region 806, which has the first conductivity type (e.g., p), is arranged in the substrate 802 and meets the buried well region 804 at a junction 808. This junction 808 is buried beneath an upper surface of the semiconductor substrate 802. A shallow well region 810, which has the second conductivity type and may be referred to in some instances as a high voltage well (e.g., high voltage n-well (HVNW), is arranged within the body region 806. The drain region 812 has the second conductivity type and is arranged in the shallow well region 810. The source region 814 has the second conductivity type and is arranged in the body region 806. Isolation structures 816 can laterally bound the device 800 to isolate the device from other neighboring devices. A gate electrode 818 is formed over a channel region 820 in the body region 806, and is separated from the channel region 820 by a gate oxide 822. The resistor structure 824 is formed over a field oxide 826, which overlies the shallow well region 810 that acts as a drift region for the device. Thus, during operation, current selectively flows between source and drain regions 814, 812 through the channel region 820 based on whether a gate voltage exceeds a threshold voltage of the device. A body contact 828 is also shown.

For clarity, example doping types are superimposed on FIG. 9, however it will be appreciated that the illustrated doping types can be "flipped" in other embodiments of FIG. 9 and for all embodiments disclosed herein. For example, although FIG. 9 illustrates n-type source and drain regions 812, 814, and a p-type body region 806; in other embodiments the source and drain regions 812, 814 could be p-type and the body region 806 could be n-type, provided other regions' conductivity types are similarly flipped.

Figure 10:
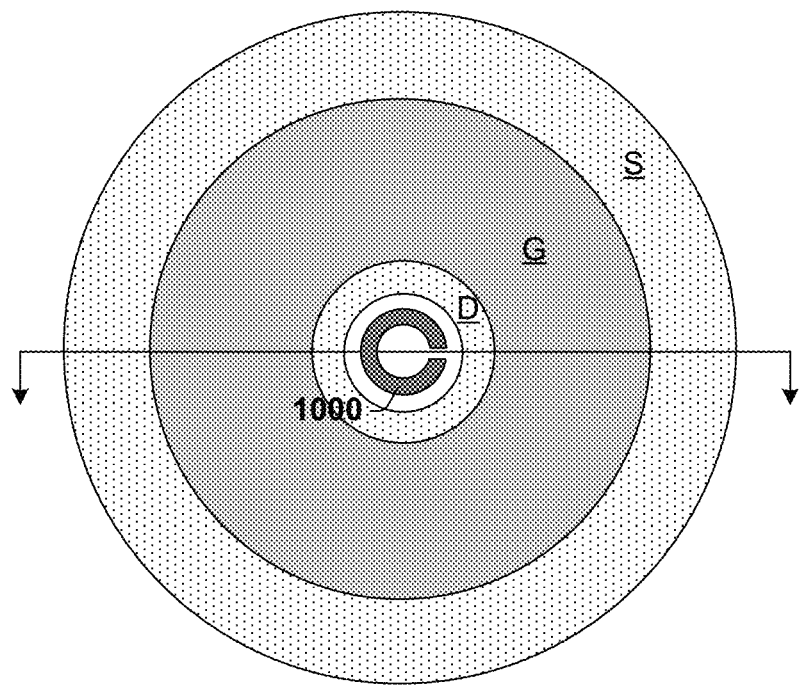
FIG. 10 illustrates a top view of a high voltage device which includes a resistor over a drain region in accordance with some embodiments.

As shown in FIG. 10, although the previous embodiments have shown resistive structures as spiral structures, the present concept is not limited to spiral structures. Thus, FIG. 10 shows another example where the resistive structure is a C-shaped structure 1000, which could also be inserted into the previously illustrated embodiments of FIGS. 1-9 in place of the spiral resistive structures illustrated therein.

Figure 11:
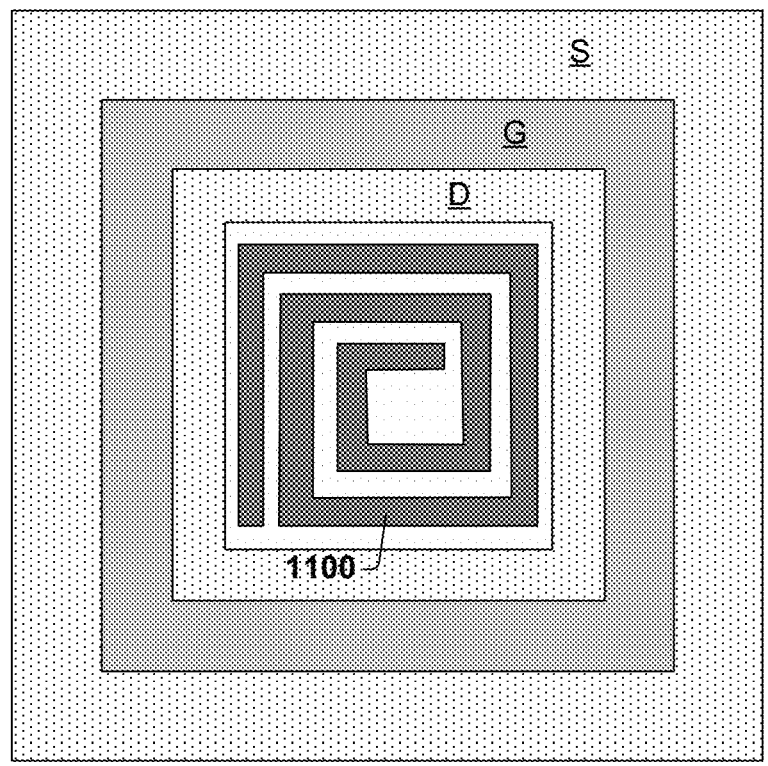
FIG. 11 illustrates a top view of a high voltage device which includes a resistor over a drain region in accordance with some embodiments.

Further, as shown in FIG. 11, although it has been mentioned that using curved surfaces without sharp corners can help to ward off electric field spiking, polygonal resistive structures are also contemplated as falling within the scope of the present disclosure. Thus, FIG. 11 shows an example of a resistive structure 1100 that includes a number of linear segments that have ever-shortening lengths to form a spiral shape. Linear segments could also be arranged to form C shaped, U-shaped, or G shaped structures, among others, all of which are contemplated as falling within the scope of the present disclosure.

Whatever the particular structure used, the width and length of these resistive structures, as well as the materials used for the resistive structures help determine the resistance of the resistive structure. Other factors being equal, resistive structures that have longer lengths tend to provide larger resistances than resistive structures with shorter lengths. Similarly, resistive structures that have smaller widths tend to provide larger resistances than resistive structures with larger widths. Thus, when made of the same material, a first spiral with many narrow, tightly spaced windings will tend to advantageously exhibit a greater resistance than a second spiral with fewer windings that are wider. However, in applications where the device is used in high voltage applications, for example greater than 100 V between the source and drain regions, the width of the resistor should be large enough to be wide enough to reliably withstand high currents or voltages that may occur without suffering from melting, localized heating, or electro-migration issues. In some embodiments, the material of the resistor structure is polysilicon, and the geometry of the windings is chosen so the resistor element has a resistance between approximately 20 ohms and approximately 50 ohms. Also, although the illustrated drain regions in FIGS. 2-9 have curved surfaces that are circular in shape, other drain regions could be oval in shape, or ring shaped, or have more complex curved or rounded surfaces, such as devices having a plurality of fingers. The same is true when polygonal shapes are utilized.

Figure 12:
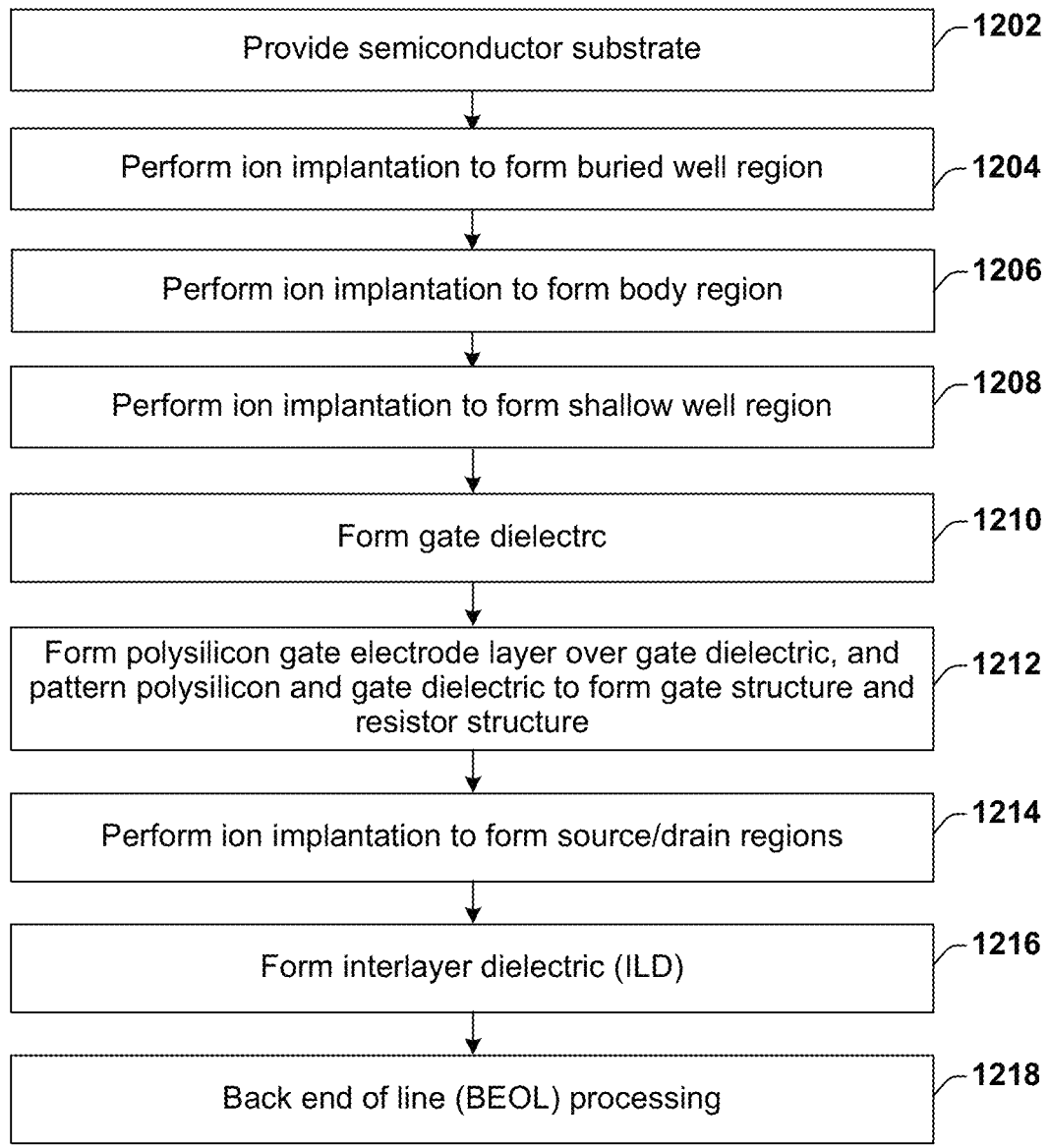
FIG. 12 illustrates a flow chart illustrating a manufacturing method for forming a deep trench capacitor in accordance with some embodiments.

FIG. 12 shows a method of manufacturing a high voltage semiconductor device in accordance with some embodiments. The method starts at 1202, when a semiconductor substrate is provided. At 1204, dopant impurities of a first dopant type are implanted into the substrate to form a buried well region. At 1206, dopant impurities of the first dopant type are implanted into the semiconductor substrate to form a body region. At 1208, dopant impurities of the first dopant type are implanted into the semiconductor substrate to form a shallow well region, such as a high voltage well region. At 1210, a gate dielectric is formed. At 1212, a polysilicon resistor structure is formed to establish a gate electrode and a resistor structure over the drain region. The resistor structure is perimeterally bounded by an inner edge of the gate structure. At 1214, dopant impurities of the second dopant type are implanted into the semiconductor substrate to form a source region and a drain region. The drain region is perimeterally bound by the inner edge of the gate electrode. At 1216, an interlayer dielectric (ILD) is formed over the gate structure. In 1218, back end of line (BEOL) processing, such as formation of interconnect is carried out.

Figure 13:
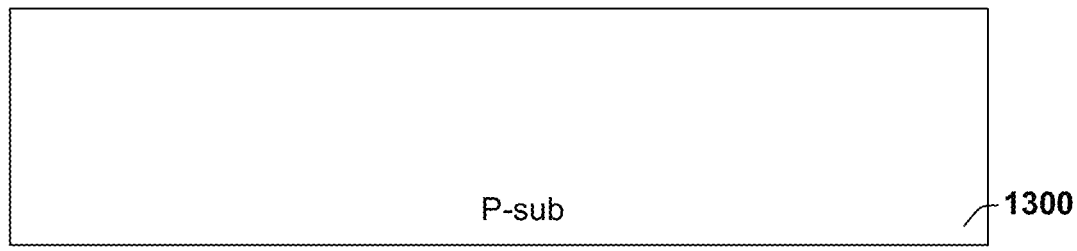
FIGS. 13-20 depict a series of cross-sectional views that collectively illustrate a method of forming a high voltage device in accordance with some embodiments.

In FIG. 13, a semiconductor substrate 1300 is provided. In the illustrated example of FIG. 13, the substrate is shown as a p-type substrate for clarity, but it will be appreciated that n-type substrates or other substrates can also be used. The semiconductor device may be a bulk semiconductor (e.g., silicon) wafer, a binary compound substrate (e.g., a GaAs wafer), a ternary compound substrate (e.g., AlGaAs), or higher order compound wafers, among others. Further, semiconductor substrate 1300 can also include non-semiconductor materials such as oxide in silicon-on-insulator (SOI), partial SOI substrate, polysilicon, amorphous silicon, or organic materials, among others. In some embodiments, the semiconductor substrate can also include multiple wafers or dies which are stacked or otherwise adhered together. The semiconductor substrate 202 can include wafers which are cut from a silicon ingot, and/or any other type of semiconductor/non-semiconductor and/or deposited or grown (e.g., epitaxial) layers formed on an underlying substrate.

Turning now to FIGS. 14-20, one can see a method of device manufacturing which is illustrated as a series of cross-sectional views. It will be appreciated that not all illustrated steps are necessarily required, and in other embodiments some of these steps may be omitted. Further, in other embodiments, additional process steps which are not illustrated herein may be present. Further still in other embodiments, the order of the illustrated processing steps can be re-arranged, for example, the operations illustrated in FIGS. 15 and 16 can be transposed, as can other steps. All such embodiments are contemplated as falling with the scope of the present disclosure.

Figure 14:
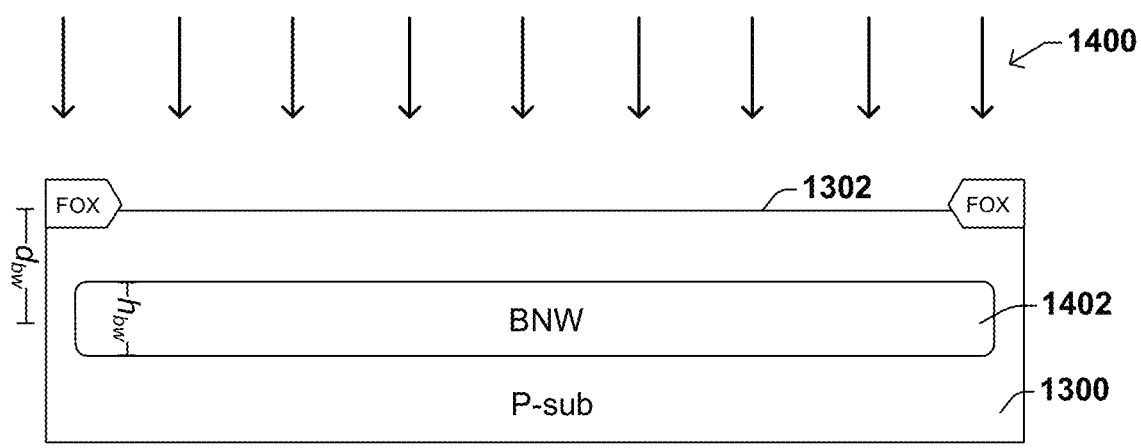

In FIG. 14, an ion implantation 1400 is carried out to form a buried well region 1402 in the semiconductor substrate 1300. In the illustrated example, the buried well region is shown as a buried n-well region (BNW), and is implanted deep into the substrate to have a peak doping at depth, $d_{bw}$. Subsequent thermal processes, such as anneals cause the BNW to diffuse outwardly to have height, $h_{bw}$, although the p-substrate can still separate the buried well region 1402 from upper semiconductor substrate surface 1302.

Figure 15:
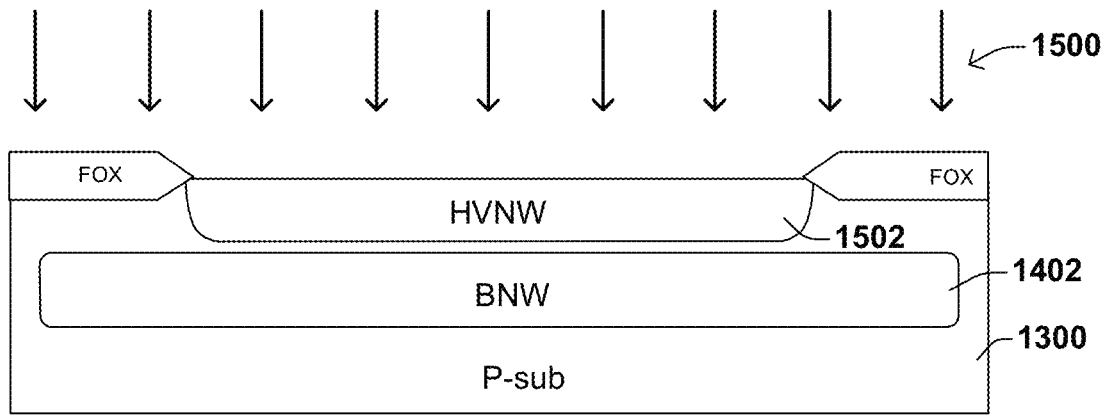

In FIG. 15, a shallow well implant 1500 is carried out to form a shallow well region 1502 over the buried n-well region 1402. In the illustrated example, the shallow well region 1502 is shown as a high voltage n-well region (HVNW). The shallow well region 1502 is shallower than the buried well region 1402, and is also narrower with the buried well region. Thus, the buried well region can extend laterally beyond outer sides of the shallow well in all directions in some embodiments.

Figure 16:
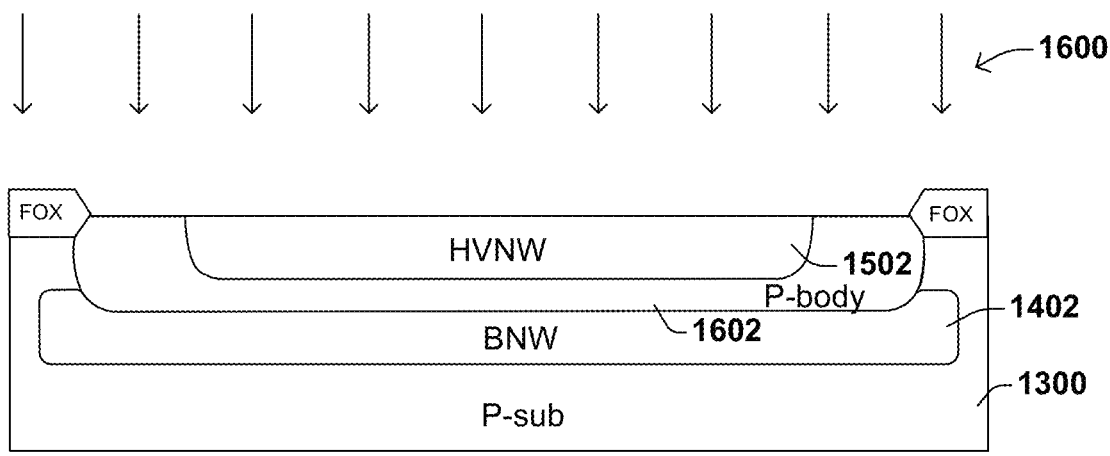

In FIG. 16, a body implant 1600 is carried out to form a body region 1602 in the substrate 1300. In the illustrated example, the body region 1602 is shown as a p-type body region. The body region 1602 is disposed below the shallow well 1502 and above the buried well 1402, and laterally surrounds the shallow well 1502.

Figure 17:
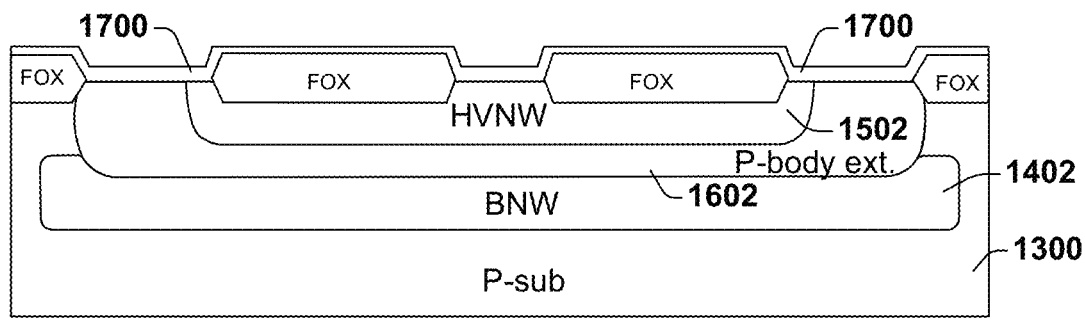

In FIG. 17, a gate dielectric 1700 is formed over a surface of the workpiece. In some embodiments, the gate dielectric is a high-k dielectric, while in other embodiments other dielectric layers, such as silicon dioxide ($SiO_2$) can be used. The gate dielectric 1700 can be grown (e.g., in a furnace or epitaxially) or can be spun on in some embodiments.

Figure 18:
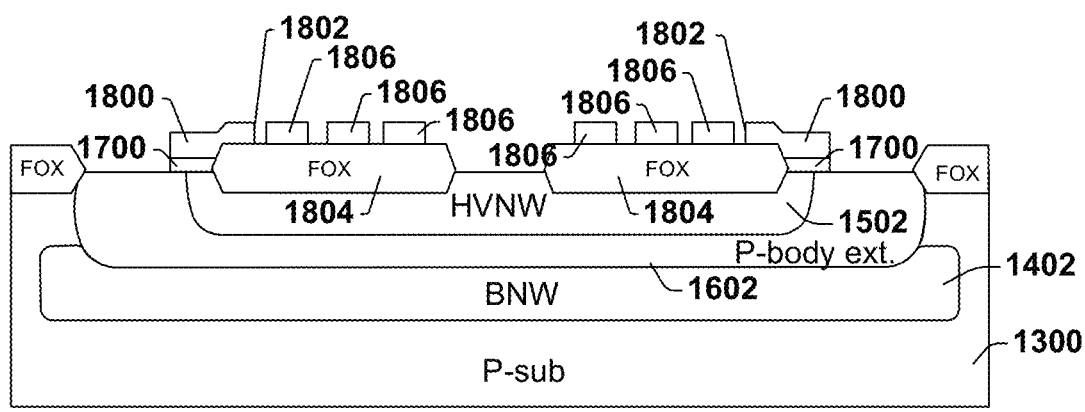

In FIG. 18, a layer of polysilicon is formed over the gate dielectric 1700. A mask layer (not shown) is then formed and patterned over the polysilicon layer 1800, and an etch is carried out with the mask in place to form patterned gate electrodes 1800. In the illustrated embodiment, an inner edge 1802 of the gate electrode 1800 extends up over field oxide region 1804. The region of the gate electrode 1800 aligned over the field oxide 1804 can be referred to as a field plate, and can help to smooth electric field lines in a drift region of the final manufactured device. Concurrent with the formation of gate electrodes 1800, resistor structure 1806 is patterned over the field oxide. As previously described, the resistor structure 1806 can be spiral or polygonal in shape as viewed from above, in some embodiments.

Figure 19:
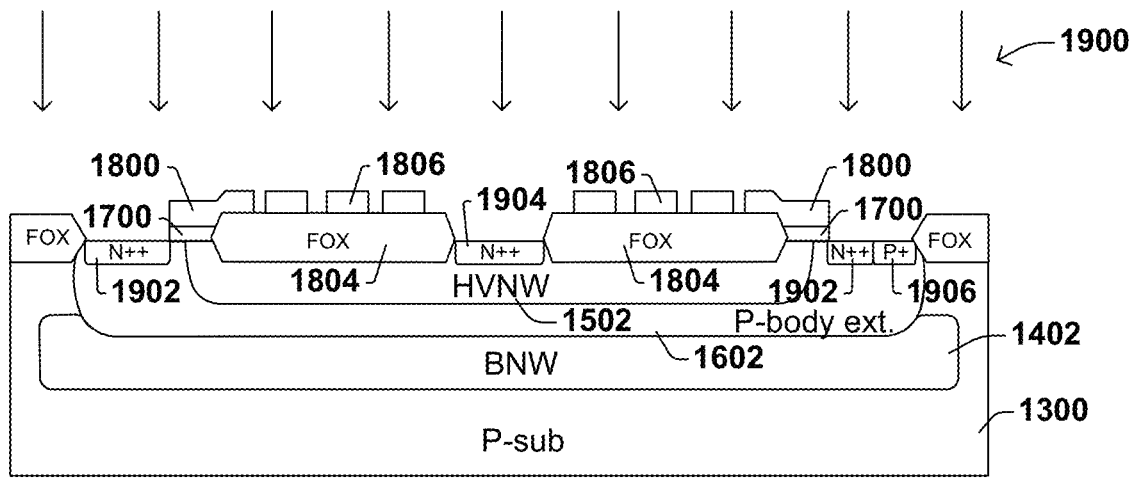

In FIG. 19, ion implantation 1900 is carried out to form source region 1902, which is self-aligned to an edge of the gate electrode 1800, as well as to form drain region 1904, which is arranged in a central region of field oxide 1804. The illustrated source/drain regions are illustrated as being highly-doped n-type regions (N++). Ion implantation is also carried out with a separate mask in place (not shown) to form a body contact region 1906. The illustrated body contact region is illustrated as being a highly doped p-type region (P+).

Figure 20:
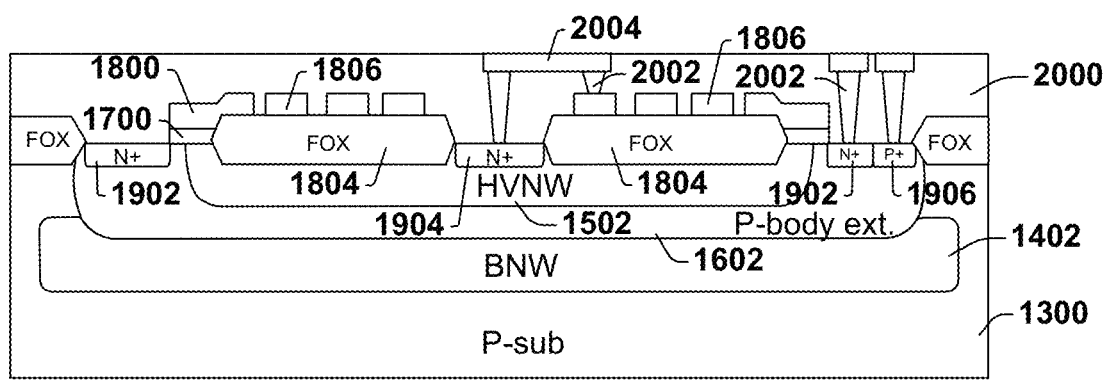

In FIG. 20, an interlayer dielectric (ILD) layer 2000 is formed over the structure, and contact openings, via openings and/or trenches are formed in the ILD. Contacts and/or vias 2002, as well as a first metal layer 2004 are then formed to couple the drain region 1904 in series with the resistor structure 1806.

Therefore, it will be appreciated that the present disclosure provides techniques related to resistor structures that are arranged in series with drain regions of a field effect transistor device. The resistor structures are also arranged over the drain so as to be perimeterally bounded by an inner edge of the gate electrode, possibly being aligned over the drain region itself and/or being aligned over a drift region of the device. Compared to other approaches, these resistor structures provide improved power surge protection. Thus, these resistor structures can provide improved performance and/or longer device lifetimes than other approaches.

Some embodiments of the present disclosure relate to a semiconductor device. The device includes a drain region, a channel region concentrically surrounding the drain region, and a source region concentrically surrounding the channel region. The channel region separates the drain region from the source region. A gate electrode is arranged over the channel region and has an inner edge proximate to the drain.

A resistor structure is made up of a curved or polygonal path of resistive material arranged over the drain and coupled to the drain, the resistor structure being perimeterally bounded by the inner edge of the gate electrode.

Other embodiments relate to a semiconductor device. The semiconductor device has a drain region arranged in the semiconductor substrate. A drift region is arranged in the semiconductor substrate and surrounds the drain region. A channel region is arranged in the semiconductor substrate and surrounds the drain region. The drift region separates the drain region from the channel region. A source region is arranged in the semiconductor substrate and surrounds the channel region. The channel region separates the drain region from the source region. A gate electrode is arranged over the channel region. A resistor structure, which is made up of a curved or polygonal path of resistive material, is aligned over the drain or the drift region and is coupled to the drain.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first doped region disposed in a substrate and having a first doping conductivity type, the first doped region having an inner edge and an outer edge;
   a second doped region disposed in the substrate and having a second doping conductivity type opposite the first doping conductivity type, the second doped region surrounding the outer edge of the first doped region;
   a buried well region disposed in the substrate and having the first doping conductivity type, the buried well region extending fully under the first doped region and the second doped region;
   a shallow well region disposed in the substrate and having the first doping conductivity type, wherein the shallow well region is completely separated from the buried well region by the second doped region;
   a third doped region disposed in the substrate and having the first doping conductivity type, the third doped region surrounding the second doped region such that the second doped region separates the first doped region from the third doped region;
   a resistor structure arranged over the substrate and perimeterally bounding the outer edge of the first doped region, the resistor structure having a first end and a second end which are connected by a curved or polygonal path of resistive material.

2. The semiconductor device of claim 1, wherein the second doped region concentrically surrounds the first doped region, and wherein the third doped region concentrically surrounds the second doped region.

3. The semiconductor device of claim 1, wherein the first end of the resistor structure is electrically coupled to the first doped region, and the second end of the resistor structure is electrically isolated from the third doped region.

4. The semiconductor device of claim 1, further comprising a gate electrode arranged over the second doped region, the gate electrode separated from the second doped region by a gate dielectric, and the gate electrode having an inner edge proximate to the outer edge of the first doped region.

5. The semiconductor device of claim 1, further comprising:
   a dielectric region surrounding the first doped region, wherein the resistor structure is disposed on an upper surface of the dielectric region.

6. The semiconductor device of claim 1, wherein the resistor structure comprises polysilicon.

7. The semiconductor device of claim 1, wherein the curved or polygonal path of resistive material is C-shaped.

8. The semiconductor device of claim 1, wherein the resistor structure exhibits an absence of sharp corners as viewed from above.

9. The semiconductor device of claim 1, further comprising:
   a first contact extending upwards from the first doped region;
   a metal interconnect layer coupled to the first contact and extending horizontally over the substrate; and
   a second contact or via extending downward from the metal interconnect layer to the curved or polygonal path of resistive material.

10. An integrated circuit, comprising:
    a ring-shaped drain region disposed in a substrate, the ring-shaped drain region having an inner edge and an outer edge;
    a channel region surrounding the ring-shaped drain region;
    a source region surrounding the channel region, wherein the channel region separates the ring-shaped drain region from the source region;
    a gate electrode arranged over the channel region, the gate electrode separated from the channel region by a gate dielectric and having an inner edge proximate to the outer edge of the ring-shaped drain region; and
    a resistor structure arranged over and spaced apart from an upper surface of the substrate, the resistor structure having a first end and a second end which are connected by a curved or polygonal path of resistive material, and the resistor structure residing within the inner edge of the ring-shaped drain region.

11. The integrated circuit of claim 10, wherein the first end of the resistor structure is electrically coupled to the ring-shaped drain region, and the second end of the resistor structure is electrically isolated from the gate electrode and the source region.

12. The integrated circuit of claim 10, further comprising:
    a dielectric region arranged in a center opening of the ring-shaped drain region, the dielectric region including an upper surface that extends continuously from a first outermost sidewall of the dielectric region to a second outermost sidewall of the dielectric region opposite the first outermost sidewall, wherein the resistor structure is disposed on the upper surface of the dielectric region and wherein an outermost perimeter of the resistor structure is bounded by an outermost edge of the dielectric region.

13. The integrated circuit of claim 10, further comprising:
    a drain contact extending upwards from the ring-shaped drain region;
    a metal interconnect layer coupled to the drain contact and extending horizontally over the substrate; and a contact or via extending downward from the metal interconnect layer to the curved or polygonal path of resistive material.

14. The integrated circuit of claim 10, wherein the resistor structure has a resistance between approximately 20 ohms and approximately 50 ohms.

15. The integrated circuit of claim 10, wherein the resistor structure has an outer perimeter that is bounded by the inner edge of the ring-shaped drain region.

16. An integrated circuit, comprising:
a dielectric region disposed on a semiconductor substrate, the dielectric region including a body of dielectric material that extends continuously from a first outermost sidewall of the dielectric region to a second outermost sidewall of the dielectric region opposite the first outermost sidewall;
a ring-shaped drain region disposed on the semiconductor substrate and concentrically surrounding the dielectric region;
a ring-shaped channel region disposed in the semiconductor substrate and concentrically surrounding the ring-shaped drain region;
a ring-shaped source region disposed in the semiconductor substrate and concentrically surrounding the ring-shaped channel region, the ring-shaped channel region separating the ring-shaped drain region from the ring-shaped source region;
a gate electrode arranged over the ring-shaped channel region, the gate electrode separated from the ring-shaped channel region by a gate dielectric; and
a resistor structure arranged over the dielectric region and residing within an inner edge the ring-shaped drain region, the resistor structure having a first end and a second end which are connected by a curved or polygonal path of resistive material.

17. The integrated circuit of claim 16, further comprising:
a drain contact extending upwards from the ring-shaped drain region;
a metal interconnect layer coupled to the drain contact and extending horizontally over the semiconductor substrate; and
a contact or via extending downward from the metal interconnect layer to the curved or polygonal path of resistive material.

18. The integrated circuit of claim 16, wherein the resistor structure has an outermost edge that is perimeterally bounded by the inner edge of the ring-shaped drain region.

19. The integrated circuit of claim 16, wherein the resistor structure has a resistance between approximately 20 ohms and approximately 50 ohms.

20. The integrated circuit of claim 16, wherein the resistor structure comprises polysilicon.

* * * * *